(12) United States Patent
Capua et al.

(10) Patent No.: US 9,377,669 B2
(45) Date of Patent: Jun. 28, 2016

(54) METHOD AND SYSTEM FOR GENERATING AND EMITTING TERAHERTZ RADIATION

(71) Applicant: Technion Research & Development Foundation Limited, Haifa (IL)

(72) Inventors: Amir Capua, Kibbutz Hulda (IL); Gadi Eisenstein, Nesher (IL)

(73) Assignee: Technion Research & Development Foundation Limited, Haifa (IL)

( * ) Notice: Subject to any disclaimer, the term of this patent is extended or adjusted under 35 U.S.C. 154(b) by 106 days.

(21) Appl. No.: 14/453,707

(22) Filed: Aug. 7, 2014

(65) Prior Publication Data

US 2015/0043056 A1 Feb. 12, 2015

Related U.S. Application Data

(60) Provisional application No. 61/863,476, filed on Aug. 8, 2013.

(51) Int. Cl.
*G02F 2/00* (2006.01)
*G02F 1/39* (2006.01)
*H01S 5/50* (2006.01)
*B82Y 20/00* (2011.01)
*H01S 5/00* (2006.01)
*H01S 5/028* (2006.01)

(52) U.S. Cl.
CPC ............ *G02F 1/395* (2013.01); *H01S 5/5054* (2013.01); *B82Y 20/00* (2013.01); *G02F 2001/392* (2013.01); *G02F 2203/13* (2013.01); *H01S 5/005* (2013.01); *H01S 5/0287* (2013.01); *H01S 2302/02* (2013.01); *Y10S 977/759* (2013.01); *Y10S 977/762* (2013.01); *Y10S 977/774* (2013.01)

(58) Field of Classification Search
None
See application file for complete search history.

(56) References Cited

U.S. PATENT DOCUMENTS 8,928,863 B2 *  1/2015  Thielen ................ H01S 5/5045
                                                        356/28
2005/0058168 A1 *  3/2005  Hu ........................ H01S 5/22
                                                        372/44.01

OTHER PUBLICATIONS

Kolarczik et al, "Quantum coherence induces pulse shape modificaiton in a semiconductor optical amplifier at room temperature", Dec. 16, 2013, Nature Communications, pp. 1-7.*
Bayer et al. "Temperature Dependence of the Exciton Homogeneous Linewidth in In[0.60]Ga[0.40]As/GaAs Self-Assembled Quantum Dots", Physical Review B, 65(4): 041308-1-041308-4, 2002.
Boller et al. "Observation of Electromagnetically Induced Transparency", Physical Review Letters, 66(20): 2593-2696, May 20, 1991.
Borri et al. "Rabi Oscillations in the Excitonic Ground-State Transition of InGaAs Quantum Dots", Physical Review B, 66: 081306-1-081306-4, 2002.
Branciard et al. "Security of Two Quantum Cryptography Protocols Using the Dame Four Qubit States", Physical Review A, 72(3): 032301.1-032301.18, Sep. 2005.

(Continued)

*Primary Examiner* — Hemang Sanghavi

(57) ABSTRACT

A method of generating light is disclosed. The method comprises: directing an optical pulse to a semiconductor optical amplifier being at a temperature above 0° C. The optical pulse is preferably characterized by a wavelength within an emission spectrum of the semiconductor optical amplifier and by a pulse area selected to induce Rabi oscillations in the semiconductor optical amplifier, and to emit light at a frequency of at least 1 THz.

36 Claims, 7 Drawing Sheets
(4 of 7 Drawing Sheet(s) Filed in Color)

(56) References Cited

OTHER PUBLICATIONS

Choi et al. "Ultrafast Rabi Flopping and Coherent Pulse Propagation in A Quantum Cascade Laser", Nature Photonics, 4: 706-710, Oct. 2010.
Cole et al. "Coherent Manipulation of Semiconductor Quantum Bits With Terahertz Radiation", Nature, 410: 60-63, Mar. 1, 2001.
Cundiff et al. "Rabi Flopping in Semiconductors", Physical Review Letters, 73(8): 1178-1181, Aug. 22, 1994.
De Riedmatten et al. "A Solid-State Light-Matter Interface at the Single-Photon Level", Nature, 456: 773-777, Dec. 11, 2008.
Dery et al. "Self-Consistent Rate Equations of Self-Assembly Quantum Wire Lasers", IEEE Journal of Quantum Electronics, 40(10): 1398-1409, Oct. 2004.
Flagg et al. "Resonantly Driven Coherent Oscillations in A Solid-State Quantum Emitter", Nature Physics, 5: 203-207, Mar. 2009.
Fuerst et al. "Ultrafast Rabi Oscillations of Free-Carrier Transitions in InP", Physica Status Solidi B Basic Research, 104: 20-22, 1997.
Gibbs et al. "Sharp-Line Self-Induced Transparency", Physical Review A, 6(6): 2326-2334, Dec. 1972.
Giessen et al. "Self-induced Transmission on a Free Exciton Resonance in a Semiconductor", Physical Review Letters, 81(19): 4260-4263, Nov. 9, 1998.
Htoon et al. "Interplay of Rabi Oscillations and Quantum Interference in Semiconductor Quantum Dots", Physical Review Letters, 88(8): 087401-1-087401-4, Feb. 25, 2002.
Juette et al. "Self-Induced Transparency at Bound Excitons in CdS", Journal of Luminescence, 83-84: 77-82, 1999.
Lee et al. "Self-Induced Transparency in Samarium Atomic Vapor Under Condition of High Temperature and High Density", Japanese Journal of Applied Physics, 41(Pt.1/8): 5170-5176, Aug. 2002.
Lezama et al. "Electromagnetically Induced Absorption", Physical Review A, 59(6): 4732-4735, Jun. 1999.
McCall et al. "Self-Induced Transparency", Physical Review, 183(2): 457-589, Jul. 10, 1969.
Reithmaier et al. "InP Based Lasers and Optical Amplifiers With Wire-/Dot-Like Active Regions", Journal of Physics D: Applied Physics, 38: 2088-2102, 2005.
Schneider et al. "Self-induced Transparency in InGaAs Quantum-Dot Waveguides", Applied Physics Letters, 83(18): 3668-3670, Nov. 3, 2003.
Schuelzgen et al. "Direct Observation of Excitonic Rabi Oscillations in Semiconductors", Physical Review Letters, 82(11): 2346-2349, Mar. 15, 1999.
Stievater et al. "Rabi Oscillations of Excitons in Single Quantum Dots", Physical Review Letters, 87(13): 133603-1-133603-4, Sep. 24, 2001.
Yao et al. "Semiconductor Laser Dynamics Beyond the Rate-Equation Approximation", Optics Communications, 119: 246-255, Aug. 15, 1995.
Zecherle et al. "Ultrafast Few-Fermion Optoelectronics in a Single Self-Assembled InGaAs/GaAs Quantum Dot", Physical Review B, 82(12): 125314-1-125314-7, 2010.
Zilkie et al. "Time-Resolved Linewidth enhancement Factors in Quantum Dot and Higher-Dimensional Semiconductor Amplifiers Operating at 1.55 Mu-m", Journal of Lightwave Technology, 26(11): 1498-1509, Jun. 1, 2008.
Zrenner et al. "Coherent Properties of a Two-Level System Based on A Quantum-Dot Photodiode", Nature, 418: 612-614, Aug. 8, 2002.

\* cited by examiner

FIG. 7A
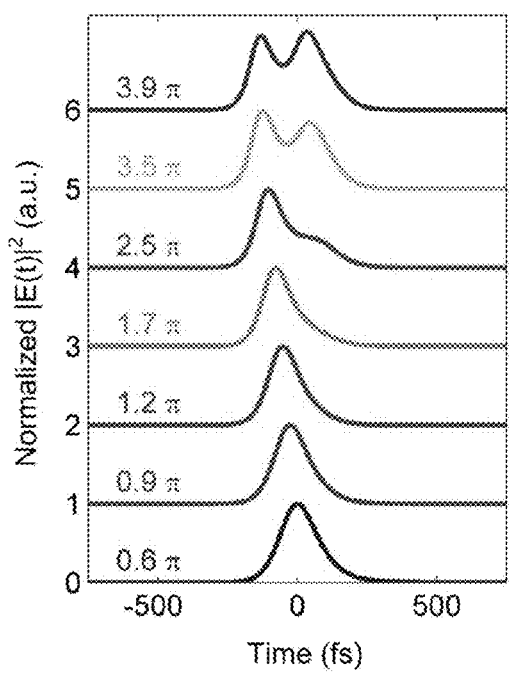
FIG. 7C
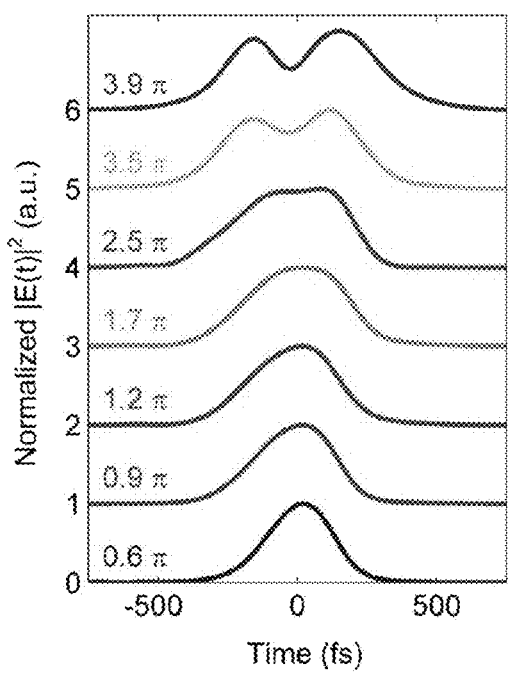
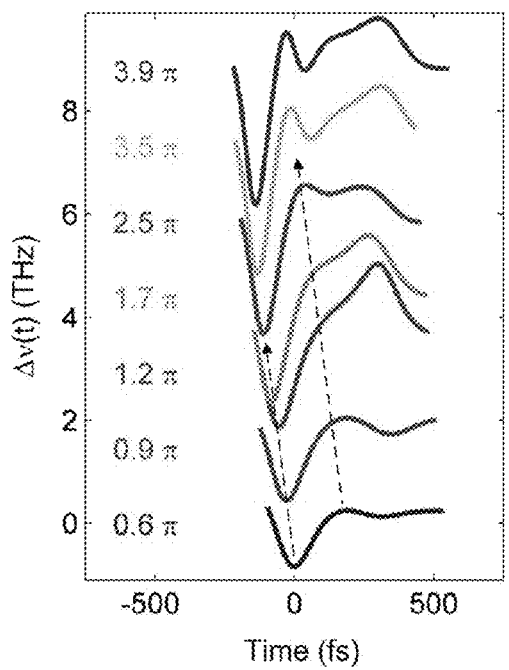
FIG. 7B
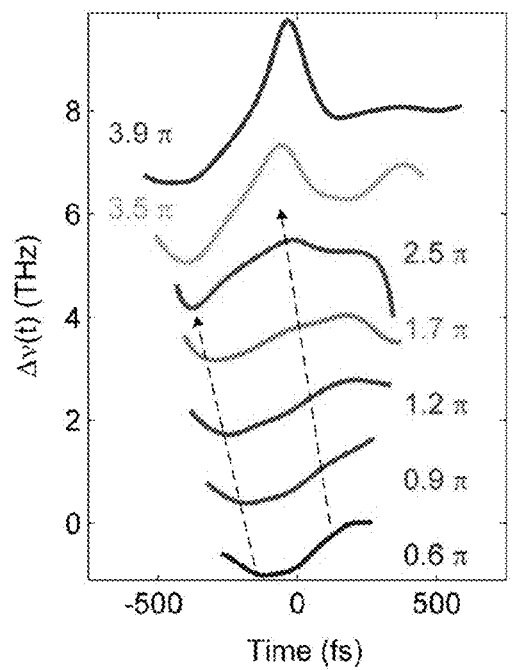
FIG. 7D

FIG. 8A
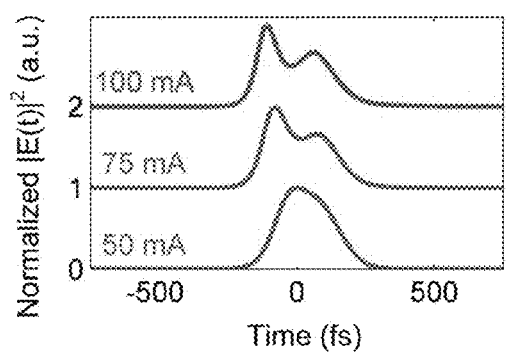
FIG. 8B
FIG. 8C
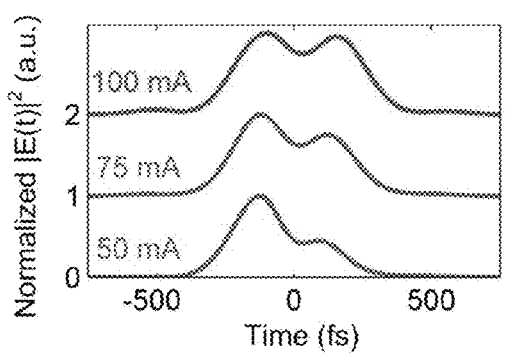
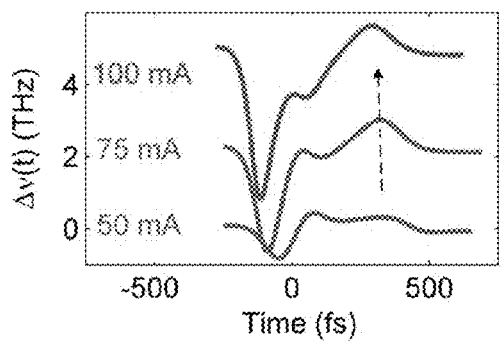
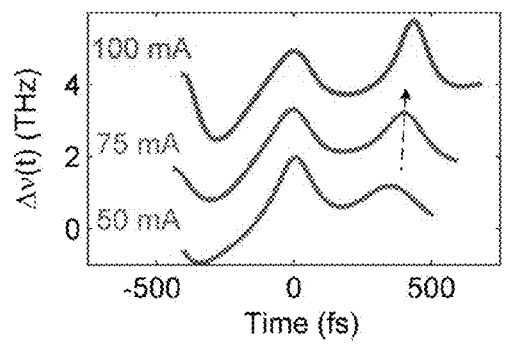
FIG. 8D

METHOD AND SYSTEM FOR GENERATING AND EMITTING TERAHERTZ RADIATION

RELATED APPLICATION

This application claims the benefit of priority under 35 USC 119(e) of U.S. Provisional Patent Application No. 61/863,476 filed Aug. 8, 2013, the contents of which are incorporated herein by reference in their entirety.

FIELD AND BACKGROUND OF THE INVENTION

The present invention, in some embodiments thereof, relates to the generation and emission of radiation, and, more particularly, but not exclusively, to generation and emission of Terahertz (THz) radiation by inducing and exploiting the coherence of electronic states.

Terahertz radiation has been produced hitherto by applying ultra-short laser pulses to biased dielectric material. Terahertz radiation pulses are generated by allowing a short laser pulse to be incident on the gap between a pair of charged strip lines separated by a semiconductor such as semi-insulating GaAs. If the wavelength of the laser light is above the band-gap of the GaAs, electron-hole pairs are generated which create a conducting path between the two lines, allowing current to flow. The sudden rise in the current between the conductors causes a large amount of radiation to be given off, caused by the sudden acceleration of the photo-generated carriers by the strong electric which exists in the gap region.

Examples of known arrangements for generating THz radiation are found in U.S. Pat. Nos. 7,974,325, 7,498,593, U.S. Published Application No. 20060076518, and European Patent Publication No. EP200606776.

SUMMARY OF THE INVENTION

According to an aspect of some embodiments of the present invention there is provided a method of generating light. The method comprises: directing an optical pulse to a semiconductor optical amplifier being at a temperature above 0° C. The optical pulse is preferably characterized by a wavelength within an emission spectrum of the semiconductor optical amplifier and by a pulse area selected to induce Rabi oscillations in the semiconductor optical amplifier, and to emit light at a frequency of at least 1 THz.

According to some embodiments of the invention the optical pulse is focused onto the semiconductor optical amplifier by a focusing optical element.

According to some embodiments of the invention the optical pulse is directly coupled onto the semiconductor optical amplifier by a waveguide.

According to an aspect of some embodiments of the present invention there is provided a system for generating light. The system comprises a light source configured for emitting an optical pulse; and a semiconductor optical amplifier operable at a temperature above 0° C. and constituted for receiving the optical pulse. The optical pulse is preferably characterized by a wavelength within an emission spectrum of the semiconductor optical amplifier, and by a pulse area selected to induce Rabi oscillations in the semiconductor optical amplifier and to emit light at a frequency of at least 1 THz.

According to some embodiments of the invention the system wherein the light source comprises an Optical Parametric Oscillator (OPO).

According to some embodiments of the invention the system wherein the light source comprises a fiber pulse source.

According to some embodiments of the invention the system wherein the light source comprises a monolithic semiconductor mode locked laser.

According to some embodiments of the invention the system wherein the light source comprises an external cavity edge emitting semiconductor laser.

According to some embodiments of the invention the system wherein the light source comprises an external cavity surface emitting semiconductor laser.

According to some embodiments of the invention the invention the system comprises a focusing optical element configured for focusing the optical pulse.

According to some embodiments of the invention the semiconductor optical amplifier comprises a waveguide for coupling the optical pulse into the semiconductor optical amplifier, wherein the focusing optical element is configured for focusing the light to enter the waveguide.

According to some embodiments of the invention the invention the system comprises a waveguide, wherein the optical pulse is directly coupled onto the semiconductor optical amplifier by the waveguide.

According to some embodiments of the invention the semiconductor optical amplifier comprises a bulk semiconductor characterized by the emission spectrum.

According to some embodiments of the invention the semiconductor optical amplifier comprises quantum confinement structures. According to some embodiments of the invention the quantum confinement structures comprise quantum dots. According to some embodiments of the invention the quantum confinement structures comprise quantum wells. According to some embodiments of the invention the quantum confinement structures quantum wires.

According to some embodiments of the invention the semiconductor optical amplifier comprises a laser diode. According to some embodiments of the invention the laser diode comprises a quantum-wire. According to some embodiments of the invention the laser diode comprises a vertical cavity surface emitting laser diode.

According to some embodiments of the invention the pulse area is selected by tuning pulse intensity.

According to some embodiments of the invention the pulse area is selected by tuning pulse duration.

According to some embodiments of the invention the pulse area is selected by selecting or tuning a bias for the semiconductor optical amplifier.

According to some embodiments of the invention the semiconductor optical amplifier is biased to operate in a gain regime thereof.

According to some embodiments of the invention the duration is less than 1 ps.

According to some embodiments of the invention the duration is less than 10 fs.

According to an aspect of some embodiments of the present invention there is provided an imaging system. The imaging system comprises the light generating system as delineated above and optionally as further detailed hereinbelow.

According to an aspect of some embodiments of the present invention there is provided a spectroscopy system. The spectroscopy system comprises the light generating system as delineated above and optionally as further detailed hereinbelow.

According to an aspect of some embodiments of the present invention there is provided a communication system.

The communication system comprises the light generating system as delineated above and optionally as further detailed hereinbelow.

According to an aspect of some embodiments of the present invention there is provided a sensing system. The sensing system comprises the light generating system as delineated above and optionally as further detailed hereinbelow.

According to an aspect of some embodiments of the present invention there is provided a system for determining compositional information of a structure, which system comprises the light generating system as delineated above and optionally as further detailed hereinbelow.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 1A and 1B are schematic illustrations of a system for generating light, according to some embodiments of the present invention;

FIG. 2 is a flowchart diagram of a method suitable for generating light, according to various exemplary embodiments of the present invention;

FIG. 3 is a schematic illustration of an application system, according to some embodiments of the present invention;

FIG. 4 is a schematic illustration of a communication system 70, according to some embodiments of the present invention;

FIGS. 5A-5C are graphs showing propagation of an approximately 200 fs optical pulse whose area is $\pi/2$, as obtained in simulations and experiments performed according to some embodiments of the present invention;

FIGS. 6A-6C are graphs showing propagation of an approximately 200 fs optical pulse whose area is $4.4\pi$, as obtained in simulations and experiments performed according to some embodiments of the present invention;

Figure 9A:
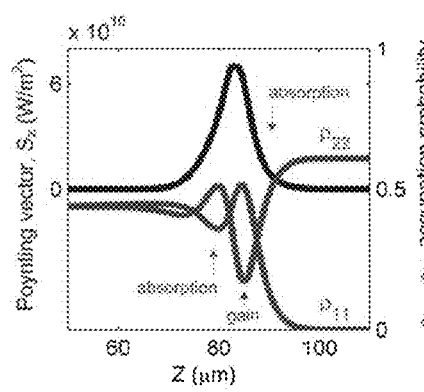
Figure 9B:
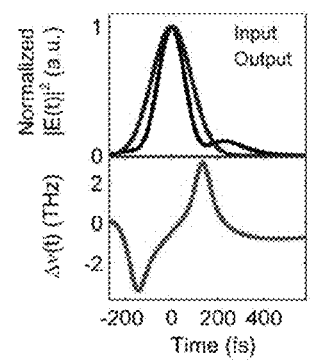
Figure 9C:
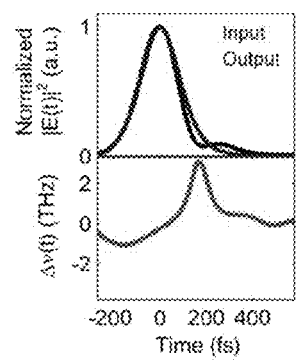

FIGS. 7A-D are graphs showing results for the area dependence of the output pulses, as obtained in simulations and experiments performed according to some embodiments of the present invention;

FIGS. 8A-D are graphs showing bias dependent responses for an input pulse whose area is $3.2\pi$, as obtained in simulations and experiments performed according to some embodiments of the present invention; and FIGS. 9A-C which are graphs showing simulations and measurements of a pulse whose area is $3.6\pi$ propagating under zero bias conditions, as obtained in according to some embodiments of the present invention.

DESCRIPTION OF SPECIFIC EMBODIMENTS OF THE INVENTION

The present invention, in some embodiments thereof, relates to the generation and emission of radiation, and, more particularly, but not exclusively, to generation and emission of THz radiation by inducing and exploiting the coherence of electronic states.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1A:
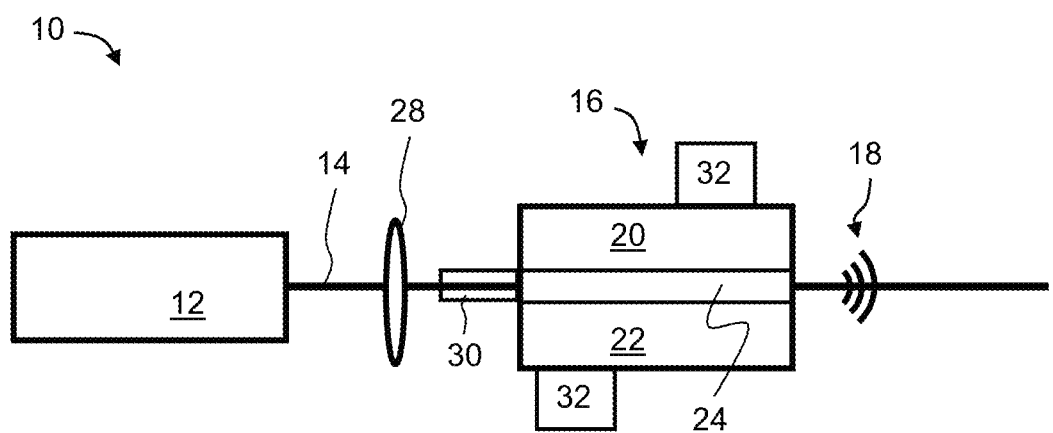
Figure 1B:
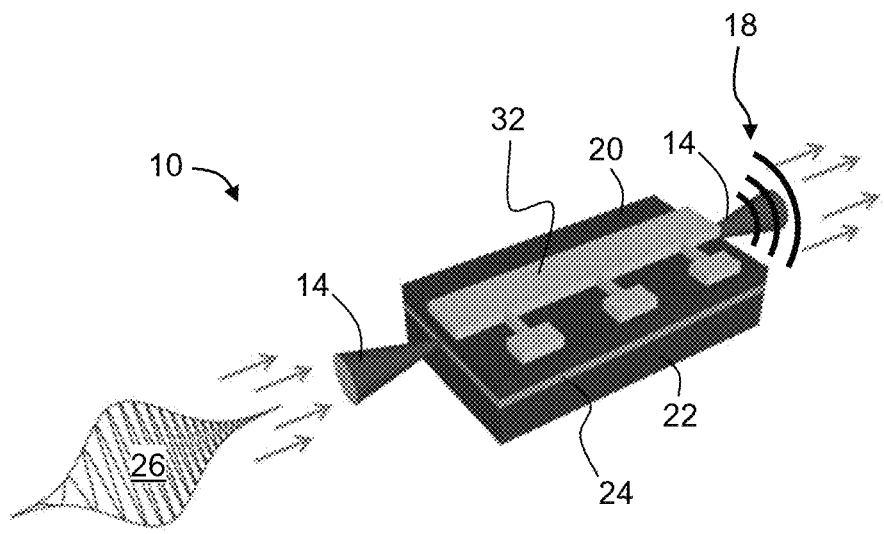

Referring now to the drawings, FIGS. 1A and 1B illustrate a side view (FIG. 1A) and an isometric view (FIG. 1B) of system 10 for generating light, according to some embodiments of the present invention. System 10 comprises a light source 12 configured for emitting an optical pulse 14, and a semiconductor optical amplifier 16 constituted for receiving optical pulse 16.

Representative examples of devices suitable to be used as light source 12, include, without limitation, an Optical Parametric Oscillator (OPO), a fiber pulse source, a monolithic semiconductor mode locked laser, an external cavity edge emitting semiconductor laser, an external cavity surface emitting semiconductor laser, and the like.

OPO has a typical size of about 1 meter long, and is optionally and preferably placed on a stable base such as an optical table. This embodiment is useful when it is not required to have a portable source. The other aforementioned pulse sources typically have small sizes, and are particularly useful when a portable source is desired. In experiments performed by the present inventors an OPO was used.

In various exemplary embodiments of the invention light source 12 is configured for emitting optical pulses characterized by a wavelength within an emission spectrum of amplifier 16 and by a pulse area 26 selected to induce Rabi oscillations in amplifier 16, and to emit light 18 at a frequency of at least 1 THz. The pulse area is linearly proportional to the integration over the complex envelope of the pulse.

The area of pulse 14 can be selected by tuning at least one of the pulse intensity, and the pulse duration. Typical pulse durations suitable for the present embodiments include, without limitation, pulse duration of less than 1 ps or less than 10 fs. Pulse durations which are above 1 ps are also contemplated. Generally, the intensity of pulse 14 determines the frequency and duration of the Rabi oscillation and hence the frequency of the THz radiation 18. Specifically, higher intensity of pulse 14 generates in amplifier 16 Rabi oscillations of higher frequency and longer duration, and lower intensity of pulse 14 generates in amplifier 16 Rabi oscillations of lower frequency and shorter duration. Thus, the intensity of pulse 14 is preferably tuned based on the desired frequency of THz radiation 18, which can be predetermined.

Rabi oscillations are the result of quantum coherent light-matter interactions. In such interactions, the electronic state of the matter de-phases quickly in practical room temperature conditions and observation of phenomena resulting from these interactions depends on the ability to make the observation prior to the de-phasing. In semiconductor materials, the de-phasing time is particularly short. The present inventors have successfully devised a system that enables to identify the time evolution of an effective electronic wavefunction of a semiconductor material in temperatures that are higher than cryogenic temperatures.

Thus, in various exemplary embodiments of the invention semiconductor optical amplifier 16 is operable at a temperature T, where T is above 0° C. or above 10° C. or above 20° C. or above 25° C., and the optical pulse 14 is directed to amplifier 16 while amplifier 16 is at temperature T. Also contemplated are embodiments in which temperature variations are applied to enhance the radiation.

Optical amplification relies on the known physical mechanisms of population inversion and stimulated emission. More specifically, amplification depends on the stimulated transition of an optical medium from an inverted, excited state to a lower, energy state. Prior to the actual amplification of optical pulse 14, a population inversion occurs, wherein more upper excited states exist than lower states. In semiconductor optical amplifier 16, the excited state is a state in which there exists an electron in the conduction band and a concomitant hole in the valance band. A transition from such an excited state, to a lower state in which neither an electron nor a hole exists, results in the creation of a photon or a stimulated emission.

Semiconductor optical amplifier 16 can be pumped either electrically or optically. Optical amplifier 16 can comprise a first doped layer 20, a second doped layer 22, and a gain layer 24 between the first 20 and second 22 doped layers. When amplifier 16 is pumped electrically, amplifier 16 comprises electrical contacts 32 contacting layers 20 and 22. Population inversion occurs responsively to a bias applied to electrical contacts 32, prior to the transmission of pulse 26. When amplifier 16 is pumped optically, gain layer 24 comprises a gain medium (for example, an erbium-containing compound, or semiconductor compounds such as, but not limited to, InGaAsP, AlGaAs, InGaAs and GaAs). In these embodiments, a pump optical radiation from an optical pump source (not shown) is directed to the gain medium in gain layer 24 for effecting the population inversion, prior to the transmission of pulse 26. Preferably, semiconductor optical amplifier 16 is pumped to operate in its gain regime. The pumping parameters of amplifier 16 (e.g., the applied bias or intensity of the pump optical radiation) can also be selected to adjust the area 26 of pulse 14 so that Rabi oscillations are generated in gain layer 24 and THz radiation 18 is emitted.

For example, the pumping parameters of amplifier 16 can be selected so as to increase the gain, thereby increasing the intensity and area of pulse 14. When the area of the pulse at the input is positive, an increment of the intensity results in increased pulse area. When the area of the pulse at the input is negative, an increment of the intensity results in a decreased pulse area. In both cases, the extent of Rabi oscillations is increased and more THz radiation is emitted. The difference between these cases is that the Bloch vector sphere rotates to opposite sides.

Gain layer 24 is preferably constituted to substantially confine optical pulse 14 in gain layer 24. In these embodiments, gain layer 24 serves also as a waveguide. This is typically achieved by a judicious selection of the optical properties of layers 20, 22 and 24. For example, layer 24 can be made from a material having a refractive index which is higher than the refractive indices of the materials that form layers 20 and 22.

Gain layer 24 of amplifier 16 can comprise a bulk semiconductor characterized by the aforementioned emission spectrum. Representative bulk semiconductor materials suitable for the present embodiments including, without limitation, binary, ternary and quaternary mixtures, e.g., InGaAsP, AlGaAs, InGaAs, GaAs and the like. Alternatively, gain layer 24 can comprise quantum confinement structures.

The term "quantum confinement," as used herein refers to a phenomenon in which there are quantized energy levels in at least one dimension.

A structure exhibits quantum confinement when the positions of charge carriers (electrons or holes) in the structure are confined along at least one physical dimension. A structure in which the charge carriers are confined along one dimension but are free to move in the other two dimensions is referred to herein as a "two-dimensional quantum confinement structure," since the structure allows free motion in two dimensions. A structure in which the charge carriers are confined along two dimensions but and are free to move only in one dimension is referred to herein as a "one-dimensional quantum confinement structure," since the structure allows free motion in one dimension. A structure in which the charge carriers are confined along all three dimensions, namely a structure in which the charge carriers are localized, is referred to herein as a "zero-dimensional quantum confinement structure," since the structure does not allow free motion.

A two-dimensional quantum confinement structure is interchangeably referred to herein as a quantum well structure, a one-dimensional quantum confinement structure is interchangeably referred to herein as a quantum wire structure, and a zero-dimensional quantum confinement structure is interchangeably referred to herein as a quantum dot structure. Thus, a quantum well, a quantum wire and a quantum dot are semiconductor crystalline structures with size dependent optical and electrical properties.

Specifically, a quantum well exhibits quantum confinement effects such that there is a one-dimensional confinement of electron-hole bound pairs or free electrons and holes. The quantum well structure can have any shape. A quantum well is typically embodied as a thin layer of a semiconductor compound, where the one-dimensional quantum confinement is along the thickness direction of the layer. The thickness of such layer is typically, but not necessarily, less than about 15 nanometers or less than about 10 nanometers, e.g., from about 0.2 nanometer to about 10 nanometers, inclusive.

A quantum wire exhibits quantum confinement effects such that there is a two-dimensional confinement of electron-hole bound pairs or free electrons and holes. The quantum wire structure is typically embodied as an elongated structure of a semiconductor compound, where the two-dimensional quantum confinement is along directions parallel to the cross-section of the stricture. The largest diameter of such elongated structure is typically, but not necessarily, less than about 15 nanometers or less than about 10 nanometers, e.g., from about 0.2 nanometer to about 10 nanometers, inclusive.

A quantum dot is typically a semiconductor crystalline structure with size dependent optical and electrical properties. Specifically, a quantum dot exhibits quantum confinement effects such that there is a three-dimensional confinement of electron-hole bound pairs or free electrons and holes. The semiconductor structure can have any shape. Preferably, the semiconductor structure the largest cross-sectional dimension of such structure is of less than about 15 nanometers or less than about 10 nanometers, e.g., from about 0.2 nanometers to about 10 nanometers, inclusive.

Exemplary materials for use as quantum confinement structures according to some embodiments of the present invention include, but are not limited to group II-VI, III-V and group IV semiconductors such as GaN, ZnS, ZnSe, ZnTe, CdS, CdSe, CdTe, GaP, GaAs; GaSb, InP, InAs, InSb, AlS, AlP, AlSb, PbS, PbSe, Ge and Si, Ge and ternary and quaternary mixtures thereof.

Semiconductor optical amplifier 16 can also be embodied as a laser diode, such as, but not limited to, a quantum wire laser diode or a vertical cavity surface emitting laser diode. In these embodiments, THz radiation 18 can be emitted in any of the two directions of the diode laser. In experiments performed by the present inventors, a quantum-wire like laser diode was used. The diode was antireflection coated and was operated in the gain and in the absorption regimes operating at room temperature.

In some embodiments of the present invention system 10 comprises a focusing optical element 28 configured for focusing optical pulse 14. Element 28 can be for example, a lens or a diffractive element. Element 28 can be constituted to focus the optical pulse 14 directly onto the gain layer 24 of amplifier 16. Alternatively, system 10 can comprise an external waveguide 30 (such as, but not limited to, an optical fiber) between light source 12 and amplifier 16. In these embodiments, focusing optical element 28 is constituted to focus optical pulse 14 into external waveguide 30. Typically, but not necessarily, external waveguide 30 has a cross section of from about 10 $\mu m^2$ to about 500 $\mu m^2$.

Unless explicitly stated otherwise, the term "waveguide" encompasses embodiments in which external waveguide 30 is used, embodiments in which layer 24 serves as a waveguide, and combination of embodiments in which layer 24 serves as a waveguide and external waveguide 30 is used.

The waveguide can have a square cross section or a rectangular cross section or a circular cross section or an oval cross section or the like. The geometrical properties, e.g., the numerical aperture, of optical element 28 are preferably such that match the shape and size of the waveguide. For example, according to a preferred embodiment of the present invention, the numerical aperture of the waveguide is higher than or equals the numerical aperture of element 28. In experiments performed by the present Inventors, a microscope objective lens which has a NA of 0.63 having a working distance of about 0.5 mm was used. Other lenses, including lenses that have longer working distances, are also contemplated.

In some embodiments, waveguide 30 is a lensed fiber. A lensed fiber is a monolithic device having an optical fiber terminated with a lens. Thus, system 10 does not necessarily include a separate focusing element. Embodiments in which waveguide 30 is a lensed fiber are advantageous because lensed fiber does not require active fiber-to-lens alignment and/or bonding of fiber to lens, it has a low insertion loss, and it enable device miniaturization and design flexibility.

The present embodiments also contemplate a configuration in which an optical fiber having a generally circular or oval cross section is placed orthogonally to a diode laser so as to couple light pulse 14 into the semiconductor. In these embodiments, the optical fiber is aligned such that its optical axis is perpendicular to the optical axis of layer 24, and light pulse 14 is directed to the cladding of the optical fiber, perpendicularly to the optical axis of the optical fiber. The cladding serves as a coupling element that couples the light pulse into layer 24. In some embodiments of the present invention waveguide 30 enacts the optical fiber. In these embodiments, waveguide 30 is aligned such that its optical axis is perpendicular to the optical axis of layer 24.

Figure 2:
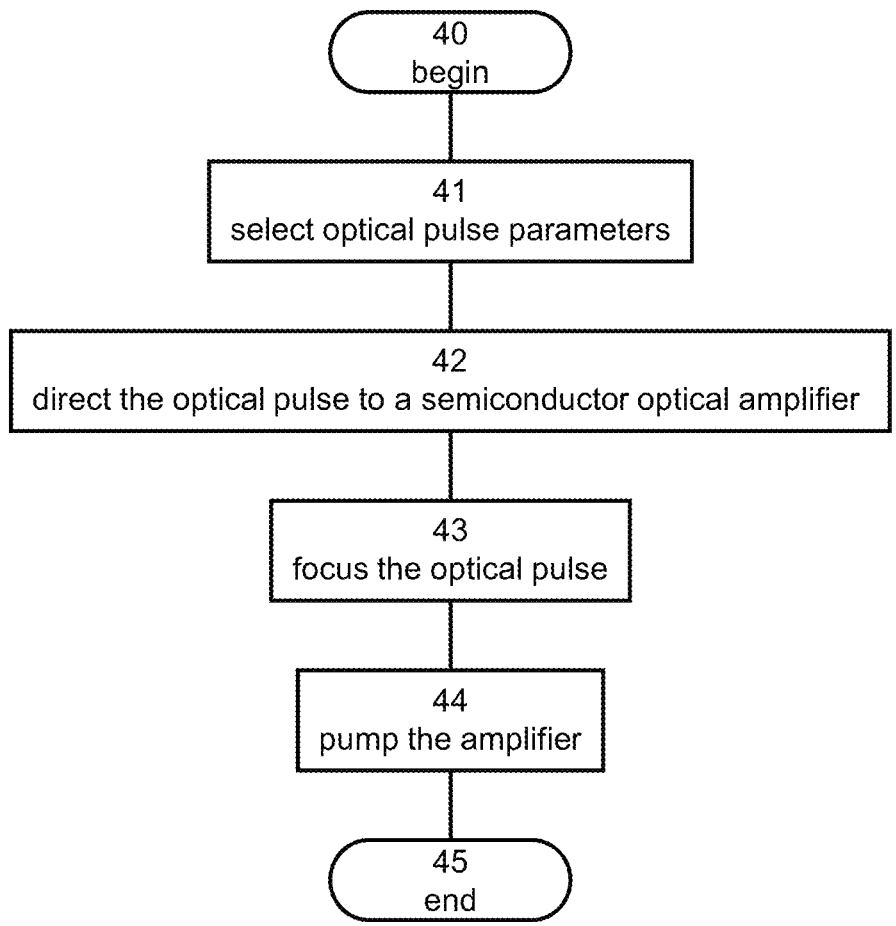

FIG. 2 is a flowchart diagram of a method suitable for generating light, according to various exemplary embodiments of the present invention. It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The method begins at 40 and optionally and preferably continues to 41 at which parameters of an optical pulse (e.g., pulse 14) are selected. The parameters can be the wavelength and/or the area of the pulse. The parameters are selected so as to generate Rabi oscillations as further detailed hereinabove. The optical pulse can be generated by a light source (e.g., source 12), and the parameter or parameters can be selected by tuning the operation parameters (e.g., intensity, pulse duration, wavelength) of the light source. Alternatively, the light source can already be configured to generate light pulses at the desired parameters in which case 41 is not executed. Still alternatively, the light source can already be configured for providing some of the parameters (e.g., a predetermined wavelength range) and the other parameters are selected by tuning the operation parameters of the light source.

The method continues to 42 at which the optical pulse is directed to a semiconductor optical amplifier (e.g., amplifier 16). During the interaction between the optical pulse and the semiconductor material of the amplifier, the temperature T of the amplifier is preferably above 0° C., or above 10° C. or above 20° C. or above 25° C. The optical pulse is characterized by a wavelength within an emission spectrum of the semiconductor optical amplifier and by a pulse area selected to induce Rabi oscillations in the amplifier, and to emit light at a frequency of at least 1 THz, as further detailed hereinabove.

In some embodiments of the present invention the optical pulse is focused 42 onto the amplifier or onto a waveguide, for example, by a focusing optical element, as further detailed hereinabove.

In some optional embodiments of the present invention the method continues to 44 at which the amplifier is pumped. The pumping can be electrically or optically. In some embodiments of the present invention the pumping parameters are selected such as to operate the amplifier in its gain regime. The pumping parameters can also be selected to provide the pulse with an area that ensures that Rabi oscillations are generated and the THz radiation is emitted.

The method ends at 45.

Figure 3:
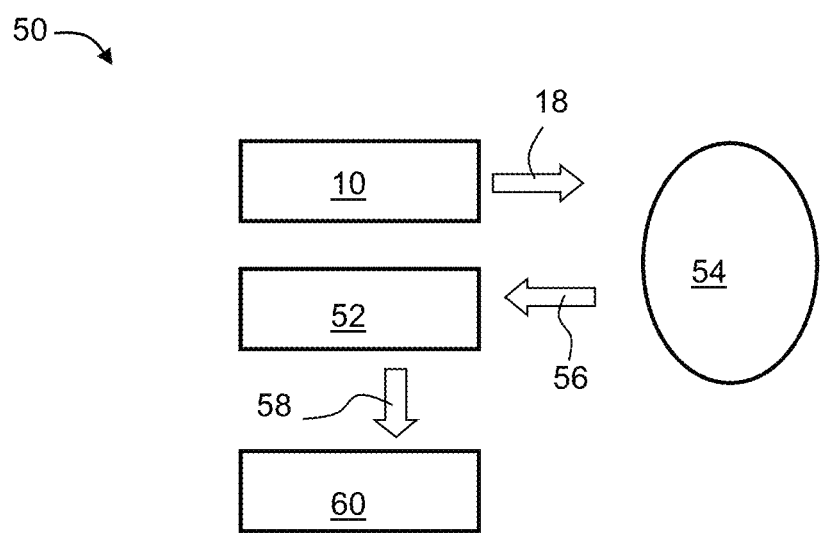

Reference is now made to FIG. 3 which is a schematic illustration of an application system 50, according to some embodiments of the present invention. System 50 comprises system 10 for generating and emission THz radiation 18 in the direction of a sample or a scene 54 as further detailed hereinabove, and a detecting system 52 configured for receiving THz signals 56 and responsively generating electrical signals 58 pertaining to sample information. System 50 optionally and preferably comprises a signal and data processor 60 that receives signals 58 and analyzes them to extract the sample information therefrom as known in the art.

Application system 50 can be, for example, an imaging system. In these embodiments, detecting system 52 generates electrical signals that pertain to an image of the sample, and signal and data processor 60 receives the signals and analyzes them to provide an image of the sample or scene. The imaging system can be configured to scan the sample and to provide scan images. For example, the imaging system can provides computerized tomography images based on multiple THz signals received for multiple relative orientations between the sample and the imaging system.

Application system 50 can alternatively be a spectroscopy system. In these embodiments, detecting system 52 generates electrical signals that pertain to spectroscopic information of the sample, and signal and data processor 60 receives the signals and analyzes them to provide the spectroscopic information. Alternatively or additionally, signal and data processor 60 provides compositional and/or structural information of the sample.

Application system 50 can alternatively be a sensing system. In these embodiments, detecting system 52 generates electrical signals that are indicative of existence of certain components and/or physical conditions in the sample or scene, and signal and data processor 60 receives the signals and analyzes them to provide an indication regarding the existence or lack thereof of the components and/or physical conditions.

Figure 4:
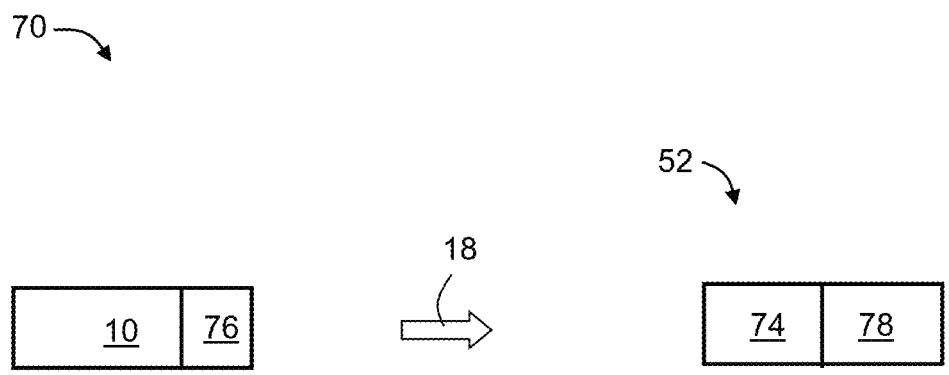

Reference is now made to FIG. 4, which is a schematic illustration of a communication system 70, according to some embodiments of the present invention. System 70 comprises system 10 for generating and emission THz radiation 18, and a THz receiving system 72 for receiving THz radiation 18. Preferably, system 10 comprises a modulator 76 that modulates the THz radiation 18, before transmitting it, in its amplitude, frequency or phase or some combination thereof, to encode the propagating THz radiation 18 with a stream of data. Modulation methods for the transmitters are well known in the art. THz receiving system 72 may comprise a detector or detector array 74 that detects the radiation and a demodulator 78 that decodes the modulated THz radiation 18 to retrieve the data stream. Communication system 70 can provides a secure short distance (1-100 m) wireless communication link. This communications link is secure since the THz radiation can be strongly absorbed by the atmosphere.

Communication system 70 can be employed also for quantum key distribution, by a direct connection between two nodes, for example, using optical fibers connecting the transmitting side 82 (commonly referred to in the literature as "Alice") with the receiving side 84 (commonly referred to in the literature as "Bob"). In principle, separate optical fiber may be used for quantum traffic, classical traffic, and data traffic. Methods used for establishing a quantum key between Alice and Bob are known in the art. For example, the BB84 protocol and/or SARG protocol can be employed. Suitable protocols are found, for example, in Branciard et al, 2005, "Security of two quantum cryptography protocols using the same four qubit states," arXiv:quant-ph/0505035, the contents of which are hereby incorporated by reference.

As used herein the terms "about" and "approximately" refer to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

At room-temperature, the coherent lifetime in semiconductors is very short, of the order of 0.5-1 ps. The present Example reports on a direct observation of quantum coherent phenomena in a room temperature semiconductor medium. The present inventors use a cross frequency resolved optical gating (X-FROG) technique with a temporal resolution of a few femto-seconds to measure the time resolved amplitude and phase of a 200 fs pulse after propagation in an InAs/InP quantum dash (wire-like) laser amplifier. In the gain regime, Rabi oscillations were demonstrated, and under absorbing conditions self-induced transparency was observed. The experimental observations are consistent with a detailed Maxwell-Schrödinger model of a two-level system fed by a carrier reservoir.

Methods

QDash Laser amplifier

The experiments utilized a 1.5 mm long laser. Its gain section comprised six InAs/InP QDash layers grown by MBE. The end facet reflectivities were reduced to about 0.04% by applying a broadband multi-layer anti-reflection coating. Estimation of the pulse area assumed a wave-guide cross-section of 9 µm² and a material index of 3.46.

Maxwell-Schrödinger model

Co-evolution of the electronic wavefunction and the electromagnetic wave were calculated by applying the Maxwell and Schrödinger equations on a two-level system which was described under the density matrix framework using the dipole approximation. The two-level system was coupled to a carrier reservoir by capture and escape processes to account for the so-called nanostructure in-a-well arrangement. The carrier dynamics were described by a set of common rate equations whose driving term is an electrical bias. The model calculated the hole and electron densities as well as carrier diffusion along the propagation axis.

All the equations were solved self-consistently using the finite difference time domain (FDTD) technique. The calculations do not invoke the usual rotating wave approximation but rather preserve the oscillatory nature of the electronic wavefunction and the electromagnetic wave. The fundamental equations that describe the light and matter interaction are given by:

$$\begin{cases} \frac{d\rho_{11}}{dt} = \Lambda_e - \gamma_{11}\rho_{11} + \frac{\mu}{i\hbar}(\rho_{12}-\rho_{21})E(t) \\ \frac{d\rho_{22}}{dt} = -\Lambda_h - \gamma_{22}\rho_{22} - \frac{\mu}{i\hbar}(\rho_{12}-\rho_{21})E(t) \\ \frac{d\rho_{12}}{dt} = -(i\omega+\gamma_{12})\rho_{12} - \frac{i\mu}{\hbar}(\rho_{11}-\rho_{22})E(t) \end{cases}$$

where $\rho_{11}$ and $\rho_{22}$ are the occupation probability of the upper and lower energy level of the two-level system, respectively, $\rho_{12}$ and $\rho_{21}$ are the carrier coherence terms, $\mu$, $\omega$, $\gamma_{11}$ and $\gamma_{22}$ are the dipole moment, angular frequency of the transition and lifetimes of the upper and lower levels, respectively, $\gamma_{12}$ is the de-phasing rate, and the coupling to the electron and hole carrier reservoirs is expressed through the rates $\Lambda_e$ and $\Lambda_h$.

The phenomenological dependence of the index on the carrier concentration was expressed by:

$$n^2 = \in_{r_0}\in(N_{res},\rho_{11}) = \in_{r_0} - C_{res}N_{res} - C_{2lev}\rho_{11}$$

where $\in_{r_0}$ is the background index, $N_{res}$ the reservoir carrier density, and $C_{res}$ and $C_{2lev}$ describe the index dependence on the reservoir and two-level populations.

The simulation assumed that the reflection of the end-facets was zero. 200 fs wide (full-width at half-maximum) transform limited Gaussian pulses were applied at the input.

Experimental Setup

An X-FROG system was used. The X-FROG system used pulses generated by a tunable optical parametric oscillator (Spectra-Physics OPAL) emitting 200 fs pulse at 82 MHz with a maximum average power of 250 mW. The spectral information was obtained using a handheld spectrometer (Ocean Optics USB 4000) and a spectral marginal was applied based on an optical spectrum analyzer (Ando AQ-6317). Optical gating was performed using a 0.5 mm long LiNbO₃ crystal. Coupling in and out of the device employed two NA 0.63 objective lenses whose losses were considered in the evaluation of the pulse area. Data retrieval was performed with commercial software package (Femtosoft Technologies). Typical convergence errors were below 0.002. Simple modifications transform the X-FROG system into a standard FROG set up which is used for pulse pre-characterization. The X-FROG scheme was selected since is advantageous over the simple FROG technique in two ways: it offers an improved sensitivity (by up to three orders of magnitude in our case), and the extracted data can be placed on an absolute common time axis.

Results

Figure 5A:
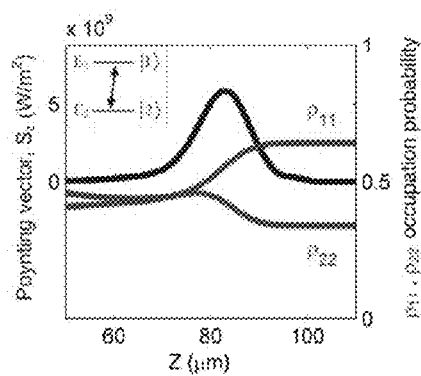
Figure 5B:
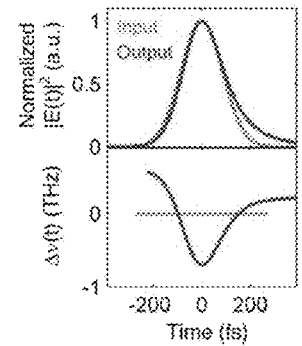
Figure 5C:
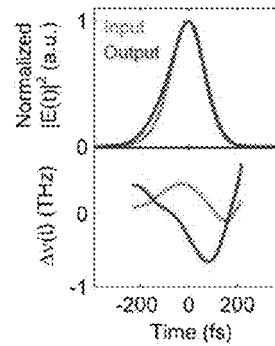

To understand the principles governing quantum coherent interactions induced by short pulses which propagate in an electrically pumped laser amplifier, the case of a moderately intense pulse, which causes the gain to saturate into transparency, is analyzed, with reference to FIGS. 5A-C.

FIGS. 5A-C are graphs showing propagation of an approximately 200 fs optical pulse whose area is $\pi/2$. The cycle of the Rabi oscillation is much longer than the pulse width.

FIG. 5A shows simulation results obtained from a Maxwell-Schrödinger model of spatially dependent occupation probability amplitudes in the upper and lower levels of the ground state (marked in the inset as the energy levels $E_1$ and $E_2$) $\rho_{11}$ and $\rho_{22}$, respectively, along a 60 µm section of the laser waveguide. Also shown is the envelope of the pulse Poynting vector in the direction of propagation. Immediately behind the pulse, the medium is transparent ($\rho_{11}=\rho_{22}$) while it exhibits population inversion ($\rho_{11}>\rho_{22}$) wherever the pulse has not arrived. The transition takes place during the pulse while far behind the pulse, the probabilities show initial recovery. The saturation effect can alternatively be described as a coherent phenomenon where the transition from gain to transparency is induced by a pulse whose area is $\pi/2$. The Rabi frequency, $\Omega=\mu E/\hbar$ of this moderate intensity $\pi/2$ pulse yields a low Ω for which the Rabi-oscillation period is longer than the pulse duration and hence $\rho_{11}$ and $\rho_{22}$ develop monotonically during the pulse and exhibit no oscillatory features.

A calculated output pulse intensity profile and instantaneous frequency shift relative to its carrier frequency are shown in FIG. 5b together with those of the input pulse. Since saturation is moderate, the pulse profile experiences no significant distortion. The behavior of the instantaneous frequency is determined by the fact that changes in the refractive index are inversely proportional to carrier density changes. In the gain regime, carrier depletion causes a red shift during the pulse leading edge followed by a recovery during the trailing end. Hence, the instantaneous frequency exhibits a shape of a valley denoting the occurrence of a gain event. Experimental characterization, using the X-FROG system, of a π/2 pulse after traversing the laser amplifier is presented in FIG. 5C. The intensity profile and the time dependent instantaneous frequency confirm the predictions of FIG. 5b.

Increasing the pulse area and correspondingly the Rabi frequency leads to Rabi oscillation periods, which are shorter than the duration of the pulse. This causes a complete inversion of the occupation probabilities known as Rabi flopping.

Figure 6A:
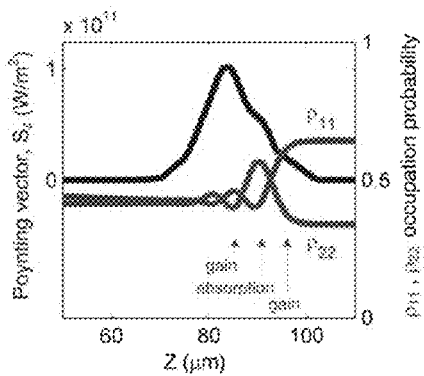
Figure 6B:
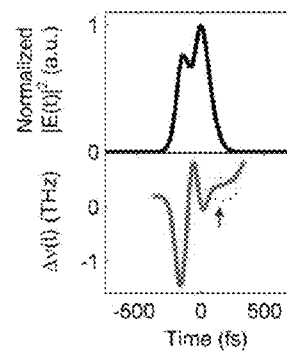
Figure 6C:
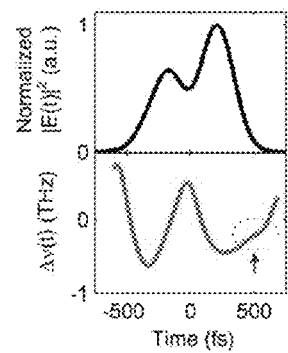

FIGS. 6A-C are graphs showing propagation of an approximately 200 fs optical pulse whose area is 4.4π. The cycle of the Rabi oscillation is shorter than the pulse duration.

FIG. 6A shows simulated spatial distribution of $\rho_{11}$ and $\rho_{22}$ along a 60 μm section of the laser waveguide under conditions of 10 dB gain together with a 4.4π pulse which is placed 80 μm from the input facet. The conditions sensed by different parts of the pulse alternate between gain ($\rho_{11}$>$\rho_{22}$) and coherent absorption ($\rho_{11}$<$\rho_{22}$). At locations far behind and ahead of the pulse, the conditions are the same as in the "classical gain saturation" case (FIG. 5A), transparency and population inversion, respectively. During the pulse, the distributions of $\rho_{11}$ and $\rho_{22}$ exhibit clear Rabi oscillations.

FIG. 6B shows simulated output pulse. The normalized intensity profile comprises two peaks while the time dependent instantaneous frequency shows two valleys indicating two distinct gain events.

FIG. 6C shows the measured output pulse. The two-peak normalized intensity profile and the two valleys representing two gain events are clearly seen, consistent with the simulation results in FIG. 6B. Arrows are added to guide the reader's eye to the fine details in the calculated instantaneous frequency trace which are revealed also in the experimental result. These details signify the electronic wavefunction and are reproduced below. The difference in the output pulse width between FIG. 6B and FIG. 6C stems from two-photon absorption and the gain broadening inhomogeneity, both of which are not accounted for in the model. Nevertheless, the main oscillatory behavior in both the intensity profiles and the time dependent instantaneous frequency traces are clearly seen and testify to the occurrence of distinct Rabi oscillations.

The transition from classical saturation to a regime where Rabi oscillations dominate was further investigated by gradually increasing the pulse area, either by increasing the input pulse energies or by raising the bias.

FIGS. 7A-D are graphs showing results for the area dependence of the output pulses. The input pulse energy is modified to vary the pulse area from 0.6π to 3.9π while the gain is 10 dB. FIGS. 7A and 7B show simulated pulse-area dependent normalized output intensity profiles and time dependent instantaneous frequencies. Rabi oscillations are observed for input pulse areas above 2.5π. Pulse break-up and the corresponding second valley emerge gradually. The first gain saturation event shifts to earlier times as the pulse area increases.

FIGS. 7C and 7D show measured pulse-area dependent normalized output intensity profiles and time dependent instantaneous frequencies. The measurements are displayed on an absolute common time axis. The measurements show fine details all of which are consistent with the predicted behavior in FIGS. 7A and 7B. Arrows are added to guide the reader's eye to the evolution. Traces are shifted for clarity.

As demonstrated by FIGS. 7A-D, the singly peaked low power pulse profile evolves gradually into the doubly peaked shape observed for input pulse areas larger than 2.5π. The time dependent instantaneous frequency evolves correspondingly from the conventional single valley shape at low pulse energies to a double valley functional form. The first valley, which denotes classical gain saturation, shifts to earlier times as the pulse area is increased since saturation occurs obviously earlier for more intense pulses.

The pulse area can also be increased by increasing the gain level. FIGS. 8A-D show bias dependent responses for an input pulse whose area is 3.2π. Shown are output pulses for bias levels of 50 mA, 75 mA and 100 mA corresponding to gain levels 5 dB, 7.5 dB and 10 dB, respectively. FIGS. 8A and 8B show simulated results, and FIGS. 8C and 8D show results measured experimentally. Arrows are added to guide the reader's eye to the evolution. Traces are shifted for clarity. A double-peaked intensity and an instantaneous frequency profile with two valleys are seen indicating that Rabi oscillations take place. As the bias increases, these two signatures of the coherent interaction become more pronounced. In particular, the oscillation lasts for a longer part of the pulse duration as evident by the second cycle in the instantaneous frequency traces. The simulation predicts all the details measured by the X-FROG system.

A complimentary effect to the Rabi oscillations is self-induced transparency. In this case, the effective two-level system is prepared, prior to the arrival of the electromagnetic field, in its lower state. This was achieved in the present example by applying zero bias to the device to operate it in the absorption regime. Self-induced transparency means that an intense pulse may co-evolve with the medium pumping it beyond the transparency point into the gain regime. This requires that the period of the Rabi cycle is shorter than the pulse width.

The self-induced transparency is demonstrated in FIGS. 9A-C which are graphs showing simulations and measurements of a pulse whose area is 3.6π propagating under zero bias conditions. The cycle of the Rabi oscillation is shorter than the pulse duration.

FIG. 9A shows simulated spatial distribution of $\rho_{11}$ and $\rho_{22}$ along a 60 μm section of the laser waveguide under conditions of zero bias together with a 3.6π pulse which is placed 80 μm from the input facet. As shown, the leading edge of the pulse is absorbed, the following central part undergoes at the same time amplification and the trailing edge is absorbed. Thus, during the pulse the medium flips from absorption to gain and back to absorption. The unperturbed amplitude probability $\rho_{22}$ is smaller than unity due to occupation of reservoir states according to the principle of detailed balance, and the interaction optically pumps the medium so that behind the pulse it approaches transparency. Pulse propagation of this kind is well known to result in pulse compression. FIG. 9A shows that an additional gain event takes place in the trailing part of the pulse.

In the zero bias case, the free carrier density is low and its contribution to the refractive index changes is negligible compared to the one in the gain regime. Simulating this case requires therefore to modify the refractive index dependence on carrier density. At zero bias, two-photon absorption and stimulated transition heating govern the refractive index dynamics. The combined effects manifest themselves in an opposite index dependence on carrier density, compared to the gain regime. Using this dependence, the output pulse properties were calculated. FIG. 9B shows simulated normalized output intensity and the time dependent instantaneous frequency. The intensity profile shows symmetrical pulse compression, together with the time resolved instantaneous frequency.

FIG. 9C shows measured normalized output intensity and time dependent instantaneous frequency showing asymmetrical pulse compression (on the trailing edge only) as well as traces of the following second oscillation. The time dependent instantaneous frequency shows features which agree with the simulated results. While the simulation shows symmetric pulse compression, the experiment shows a clear compression on the trailing edge and a very slight compression on the leading edge. Additionally, a second trailing excitation in the intensity profile is observed which also appears in the simulations and indicates that a second oscillation cycle was initiated. The measured time resolved instantaneous frequency is consistent with the simulated result exhibiting a red shift during the pulse peak, which is followed by a sharp frequency increase during the trailing edge.

The present Example demonstrates the ability to reconstruct the time evolution of an effective electron wavefunction in a semiconductor optical amplifier at room temperature. The high resolution phase-sensitive measurement technique employed in the present example revealed intricate details of the coherent interaction between light and the electronic wavefunction enabling to demonstrate the two fundamental processes of Rabi oscillations and self-induced transparency using 200 fs wide pulses which propagated in an electrically driven InAs/InP quantum dash laser amplifier. A comprehensive simulation in which the principle interaction was governed only by the Schrödinger and two Maxwell equations, is consistent with all the measured results. The present Example explores the nature of quantum coherent interactions between electromagnetic waves and the collective wavefunction of a large ensemble of atoms.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

REFERENCES

[1] Rabi, I. I. Space quantization in a gyrating magnetic field. *Phys. Rev.* 51, 652-654 (1937).
[2] Hopf, F. A. & Scully, M. O. Theory of an inhomogeneously broadened laser amplifier. *Phys. Rev.* 179, 399-416 (1969).
[3] Lamb, G. L. JR. Analytical descriptions of ultrashort optical pulse propagation in a resonant medium. *Rev. Mod. Phys.* 43, 99-124 (1971).
[4] Cundiff, S. T. et al. Rabi flopping in semiconductors. *Phys. Rev. Lett.* 73, 1178-1181 (1994).
[5] Fürst, C., Leitenstorfer, A., Nutsch, A., Tränkle, G. & Zrenner, A. Ultrafast Rabi oscillations of free-carrier transitions in InP. *Phys. Stat. Sol. B* 204, 20-22 (1997).
[6] Giessen, H. et al. Self-induced transmission on a free exciton resonance in a semiconductor. *Phys. Rev. Lett.* 81, 4260-4263 (1998).
[7] Schülzgen, A. et al. Direct observation of excitonic Rabi oscillations in semiconductors. *Phys. Rev. Lett.* 82, 2346-2349 (1999).
[8] Jütte, M. & von der Osten, W. Self-induced transparency at bound excitons in CdS. *J. Luminescence* 83-84, 77-82 (1999).
[9] Cole, B. E., Williams, J. B., King, B. T., Sherwin, M. S. & Stanley, C. R. Coherent manipulation of semiconductor quantum bits with terahertz radiation. *Nature* 410, 60-63 (2001).
[10] Stievater, T. H. et al. Rabi oscillations of excitons in single quantum dots. *Phys. Rev. Lett.* 87, 133603 (2001).
[11] Htoon, H. et al. Interplay of Rabi oscillations and quantum interference in semiconductor quantum dots. *Phys. Rev. Lett.* 88, 087401 (2002).
[12] Zrenner, A. et al. Coherent properties of a two-level system based on a quantum-dot photodiode. *Nature* 418, 612-614 (2002).
[13] Borri, P. et al. Rabi oscillations in the excitonic ground-state transition of InGaAs quantum dots. *Phys. Rev. B* 66, 081306(R) (2002).
[14] Schneider, S. et al. Self-induced transparency in InGaAs quantum-dot waveguides. *Appl. Phys. Lett.* 83, 3668 (2003).
[15] Flagg, E. B. et al. Resonantly driven coherent oscillations in a solid-state quantum emitter. *Nature Phys.* 5, 203-207 (2009).
[16] Choi, H. et al. Ultrafast Rabi flopping and coherent pulse propagation in a quantum cascade laser. *Nature Photon.* 4, 706-710 (2010).
[17] Zecherle, M. et al. Ultrafast few-fermion optoelectronics in a single self-assembled InGaAs/GaAs quantum dot. *Phys. Rev. B* 82, 125314 (2010).
[18] Gibbs, H. M. & Slusher, R. E. Sharp-line self-induced transparency. *Phys. Rev. A* 6, 2326-2334 (1972).
[19] Boller, K.-J., Imamoglu, A. S. & Harris, E. Observation of electromagnetically induced transparency *Phys. Rev. Lett.* 66, 2593-2596 (1991).
[20] Lezama, A., Barreiro, S. & Akulshin, A. M. Electromagnetically induced absorption *Phys. Rev. A* 59, 4732-4735 (1999).
[21] Won-Kyu, L. et al. Self-induced transparency in samarium atomic vapor under condition of high temperature and high density. *Jpn. J. Appl. Phys.* 41, 5170-5176 (2002).
[22] Bayer, M. & Forchel, A. Temperature dependence of the exciton homogeneous linewidth in $In_{0.60}Ga_{0.40}As/GaAs$ self-assembled quantum dots. *Phys. Rev. B* 65, 041308(R) (2002).
[23] Trebino, R. *Frequency-Resolved Optical Gating: The Measurement Of Ultrashort Laser Pulses*. (Kluwer Academic Publishers, Norwell, 2002).
[24] Dery, H. & Eisenstein, G. Self consistent rate equations of self assembly quantum wire lasers. *IEEE J. Quantum Electron.* 40, 1398-1409 (2004).
[25] McCall, S. L. & Hahn, E. L. Self-induced transparency. *Phys. Rev.* 183, 457-485 (1969).

[26] Zilkie, A. J. et al. Time-resolved linewidth enhancement factors in quantum dot and higher-dimensional semiconductor amplifiers operating at 1.55 m. *J. Lightw. Technol.* 26, 1498-1509 (2008).

[27] De Riedmatten, H., Afzelius, M., Staudt, M. U., Simon, C., & Gisin N. A solid-state light-matter interface at the single-photon level. *Nature* 456, 773-777 (2008).

[28] Reithmaier, J. P. et al. InP based lasers and optical amplifiers with wire-/dot-like active regions, *J. Phys. D* 38, 2088-2102 (2005).

[29] Sargent III, M., Scully, M. O. & Lamb, W. E. Jr. Laser Physics (Westview Press, Boulder, 1978).

[30] Yao, J., Agrawal, G. P., Gallion, P. & Bowden, C. Semiconductor laser dynamics beyond the rate-equation approximation. *Opt. Comm.* 119, 246-255 (1995).

What is claimed is:

1. A method of generating light, comprising: directing an optical pulse to a semiconductor optical amplifier being at a temperature above 0° C., said optical pulse being characterized by a wavelength within an emission spectrum of said semiconductor optical amplifier and by a pulse area selected to induce Rabi oscillations in said semiconductor optical amplifier, and to emit light at a frequency of at least 1 THz.

2. The method according to claim 1, wherein said optical pulse is focused onto said semiconductor optical amplifier by a focusing optical element.

3. The method according to claim 1, wherein said directing said optical pulse comprises directly coupling said optical pulse onto said semiconductor optical amplifier by a waveguide.

4. The method according to claim 1, wherein said selection of said pulse area comprises tuning pulse intensity.

5. The method or system according to claim 1, wherein said selection of said pulse area comprises tuning pulse duration.

6. The method according to claim 5, wherein said duration is less than 1 ps.

7. The method according to claim 5, wherein said duration is less than 10 fs.

8. The method or system according to claim 1, wherein said selection of said pulse area comprises selecting a bias for said semiconductor optical amplifier.

9. A system for generating light, comprising:
 a light source configured for emitting an optical pulse; and
 a semiconductor optical amplifier operable at a temperature above 0° C. and constituted for receiving said optical pulse;
 said optical pulse being characterized by a wavelength within an emission spectrum of said semiconductor optical amplifier, and by a pulse area selected to induce Rabi oscillations in said semiconductor optical amplifier and to emit light at a frequency of at least 1 THz.

10. The system of claim 9, wherein said light source comprises an Optical Parametric Oscillator (OPO).

11. The system of claim 9, wherein said light source comprises a fiber pulse source.

12. The system of claim 9, wherein said light source comprises a monolithic semiconductor mode locked laser.

13. The system of claim 9, wherein said light source comprises an external cavity edge emitting semiconductor laser.

14. The system of claim 9, wherein said light source comprises an external cavity surface emitting semiconductor laser.

15. The system according to claim 9, further comprising a focusing optical element configured for focusing said optical pulse.

16. The system according to claim 15, wherein said semiconductor optical amplifier comprises a waveguide for coupling said optical pulse into said semiconductor optical amplifier, and wherein said focusing optical element is configured for focusing the light to enter said waveguide.

17. The system according to claim 9, further comprising a waveguide, wherein said optical pulse is directly coupled onto said semiconductor optical amplifier by said waveguide.

18. The system according to claim 9, wherein said semiconductor optical amplifier comprises a bulk semiconductor characterized by said emission spectrum.

19. The system according to claim 9, wherein said semiconductor optical amplifier comprises quantum confinement structures.

20. The system according to claim 16, wherein said quantum confinement structures comprise quantum dots.

21. The system according to claim 19, wherein said quantum confinement structures comprise quantum wells.

22. The system according to claim 19, wherein said quantum confinement structures quantum wires.

23. The system according to claim 9, wherein said semiconductor optical amplifier comprises a laser diode.

24. The system according to claim 23, wherein said laser diode comprises a quantum-wire.

25. The system according to claim 23, wherein said laser diode comprises a vertical cavity surface emitting laser diode.

26. The system according to claim 9, wherein said selection of said pulse area comprises selecting pulse intensity.

27. The system according to claim 9, wherein said selection of said pulse area comprises selecting pulse duration.

28. The system according to claim 9, wherein said selection of said pulse area comprises selecting a bias for said semiconductor optical amplifier.

29. The system according to claim 28, wherein said semiconductor optical amplifier is biased to operate in a gain regime thereof.

30. The system according to claim 9, wherein said optical pulse has duration of less than 1 ps.

31. The system according to claim 9, wherein said optical pulse has duration of more than 1 fs.

32. An imaging system, comprising the system according to claim 9.

33. A spectroscopy system, comprising the system according to claim 9.

34. A communication system, comprising the system according to claim 9.

35. A sensing system, comprising the system according to claim 9.

36. A system for determining compositional information of a structure, comprising the system according to claim 9.

* * * * *